(12) United States Patent
Murtaza et al.

(10) Patent No.: US 6,232,188 B1
(45) Date of Patent: May 15, 2001

(54) CMP-FREE DISPOSABLE GATE PROCESS

(75) Inventors: Suhail Murtaza, Dallas; Amitava Chatterjee, Plano, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/124,854

(22) Filed: Jul. 29, 1998

Related U.S. Application Data (60) Provisional application No. 60/054,299, filed on Jul. 31, 1997.

(51) Int. Cl.$^7$ ................................................... H01L 21/336
(52) U.S. Cl. ........................................... 438/300; 257/327
(58) Field of Search .................................. 438/230, 231, 438/300, 305; 257/327, 336, 344, 369

(56) References Cited

U.S. PATENT DOCUMENTS

| | | | |
|---|---|---|---|
| 4,845,046 | * 7/1989 | Shimbo | 438/486 |
| 4,948,745 | * 8/1990 | Pfiester | 439/290 |
| 4,963,501 | * 10/1990 | Ryan et al. | 438/183 |
| 4,992,388 | * 2/1991 | Pfiester | 438/290 |
| 5,168,072 | * 12/1992 | Moslehi | 438/300 |
| 5,322,809 | * 6/1994 | Moslehi | 438/290 |
| 5,429,956 | * 7/1995 | Shell et al. | 438/291 |
| 5,468,665 | 11/1995 | Lee et al. | 437/44 |
| 5,496,750 | 3/1996 | Moslehi | 437/41 |
| 5,716,861 | * 2/1998 | Moslehi | 438/231 |

OTHER PUBLICATIONS

"Integration of ICP High–Density Plasma CVD With CMP and It's Effects on Planarity for Sub–0.5μm CMOS Technology," SPIE vol. 2875, pp. 265–274 (Jiro Yota, Maureen R. Brongo, Thomas W. Dyer and Kenneth P. Rafftesaeth).

"Statistical Metrology for Characterizing CMP Processes," 1997 Elsevier Science B.V., pp. 231–240 (Sharad Prasad, W. Loh, A. Kapoor, E. Chang, B. Stine, D. Boning and J. Chung).

"Chemical Mechanical Planarization of Multilayer Dielectric Stacks," SPIE vol. 2335, pp. 2–11 (Manoj K. Jain, Girish A. Dixit, Michael F. Chisholm, Thomas R. Seha, Kelly J. Taylor, Gregory B. Shinn, and Robert H. Havemann).

"MOS Fabrication Process Integrating Self–Aligned Polysilicon Gate and Post–Processed Metal Gate Devices on a Single Die," 1991 IEEE, pp. 199–203 (Ronald D. Butler and Robert E. Beaty).

"HDP Dielectric BEOL Gapfill: A Process for Manufacturing," 1996 IEEE/SEMI Advanced Semiconductor Manufacturing Conference, pp. 255–258 (M.C. Broomfield and T.A. Spooner).

(List continued on next page.)

Primary Examiner—Richard Elms
Assistant Examiner—Christian D. Wilson
(74) Attorney, Agent, or Firm—Jacqueline J. Garner; W. James Brady, III; Frederick J. Telecky, Jr.

(57) ABSTRACT

A method for forming a MOSFET transistor using a disposable gate process which has no need for a chemical mechanical polishing step to expose the disposable gate after deposition of the field dielectric. The field dielectric is deposited non-conformally by HDP-CVD over a disposable gate structure so that the disposable gate remains partially exposed. After deposition, the partially exposed disposable gate may then be removed by selective isotropic etch. In the space left by the removal of the disposable gate, the gate dielectric may be formed and the gate electrode may be deposited. Eliminating the need for exposure of the disposable gate by CMP eliminates the problem of polish rate dependence on gate pattern density.

16 Claims, 6 Drawing Sheets

OTHER PUBLICATIONS

"Assessment of Charge–Induced Damage From High Density Plasma (HDP) Oxide Deposition," 1996 1st International Symposium on Plasma Process–Induced Damage, May 13–14, Santa Clara, CA, 1996 American Vacuum Society, pp. 67–70 (Srikanth Krishnan and Somnath Nag).

"A Shallow Trench Isolation Study for 0.25/0.18$\mu$m CMOS Technologies and Beyond," 1996 Symposium on VLSI Technology Digest of Technical Papers, pp. 156–157 (A. Chatterjee, J. Esquivel, S. Nag, I. Ali, D. Rogers, K. Taylor, K. Joyner, M. Mason, D. Mercer, A. Amerasekera, T. Houston and I.C. Chen).

"Comparative Evaluation of Gap–Fill Dielectrics in Shallow Trench Isolation for Sub–0.25$\mu$m Technologies," 1996 IEEE IEDM 96–841, pp. 32.6.1–32.6.4(S. Nag, A Chatterjee, K. Taylor, I. Ali, S. O'Brien, S. Aur. J.D. Luttmer and I–C Chen).

Wolf et al., Silicon Processing for the VLSI Era, vol. 1—Process Technology, (Lattice Press, California, 1986), pp. 185–187.*

J. R. Pfiester et al, A Self–Aligned Elevated Source/Drain MOSFET, IEEE Electron Device Letters, 11 (1990) 365.*

* cited by examiner

CMP-FREE DISPOSABLE GATE PROCESS

This application claims priority under 35 USC § 119 (e) (1) of provisional application No. 60/054,299, filed Jul. 31, 1997.

BACKGROUND AND SUMMARY OF THE INVENTION

The present invention relates to integrated circuit structures and fabrication methods, and more specifically to forming an integrated circuit structure using a disposable gate process.

BACKGROUND: DISPOSABLE GATE PROCESS

A disposable gate process has been shown to provide a method by which a CMOS transistor structure can be scaled further into the sub-micron region while maintaining sufficiently low gate sheet resistance, small junction depth, and low junction capacitance. See provisional applications 60/029,215 filed Oct. 28, 1996 and 60/019,643 filed Oct. 28, 1996, which are hereby incorporated by reference.

Figure 2A:
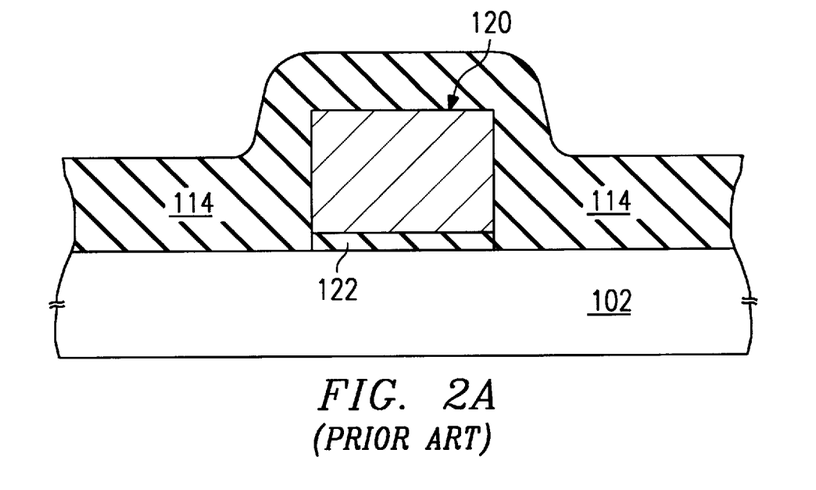
FIGS. 2A–2C illustrate a previously known step in the process.
Figure 2B:
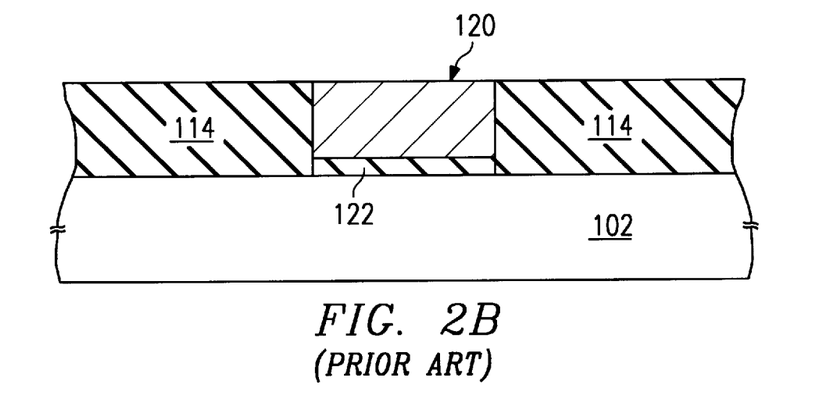
Figure 2C:
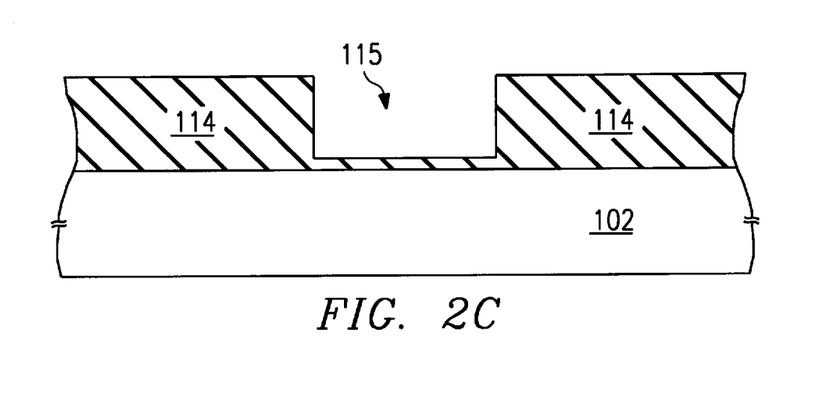

A conventional disposable gate process is illustrated in FIGS. 2A–2C. FIG. 2A shows a field dielectric 114 which was blanket deposited over a disposable gate 120 (e.g. of silicon nitride) and pad oxide 122 which was formed over a semiconductor active area 102. The field dielectric 114 is then chemically mechanically polished, leaving the surface of disposable gate 120 exposed as shown in FIG. 2B. In FIG. 2C disposable gate 120 has been removed (e.g. by a hot phosphoric acid). A gate electrode can now be deposited in the space 115 left by the removal of disposable gate 120.

The chemical mechanical polishing step (CMP) in the conventional process discussed above is a polishing technique which provides global planarization. However, CMP can be a problematic step in this conventional process because of the polish rate dependence on gate density. Yota et al., *Integration of ICP High-Density Plasma CVD with CMP and Its Effects on Planarity for Sub-0.5 µm CMOS Technology*, 2875 Proceedings of the SPIE 265 (1997), which is hereby incorporated by reference. The CMP process is difficult to control because of the pattern sensitivity of the polish rate.

Background: HDP-CVD

The basic HDP-CVD (high density plasma-chemical vapor deposition) process involves a simultaneous deposition and etch component and is already well-established in the semiconductor industry. HDP-CVD can provide very non-conformal deposition, in which material buildup occurs almost complete on the flat surfaces of the starting structure, and not on sidewalls. See e.g., A. Chatterjee et al., *A Shallow Trench Isolation Study for 0.25/0.18 µm CMOS Technologies and Beyond*, 156 Symposium on VLSI Technology Digest (1996); S. Nag et al., *Comparative Evaluation of Gap-Fill Dielectrics in Shallow Trench Isolation for Sub-0.25 µm Technologies*, 841 IEDM (1996), which are hereby incorporated by reference.

CMP-Free Disposable Gate Process

The present application solves the problem of polish rate dependence on gate pattern density by using a highly non-conformal field dielectric to leave the disposable gate partially exposed, thereby eliminating the need to chemically-mechanically-polish the field dielectric to expose the disposable gate. In a sample embodiment, HDP-CVD oxide is deposited non-conformally as the field oxide over a disposable gate structure. The deposition process uses a sputter component to achieve minimal deposition on the sidewalls of the disposable gate. The oxide deposition is preferably stopped before the oxide filling up the trench and the oxide depositing on top of the disposable gate meet, thus leaving the sidewalls of the disposable gate partially exposed. Optionally, a short oxide etch can be used to selectively remove any oxide which deposited on the sides of the disposable gate, thereby leaving the sidewalls of the gate partially exposed. Because the sidewalls are exposed, the process can proceed directly to selective removal of the disposable gate, rather than going through a CMP step to expose the disposable gate before removal can proceed.

Advantages of the disclosed methods and structures include:
- eliminating the need for CMP after field-oxide deposition;
- simplifying the overall disposable gate process;
- eliminating pattern sensitivity to the degree of planarity;
- high-k gate dielectrics and/or metal gates (e.g. aluminum) are not subjected to high temperatures in a disposable gate process;
- limits on lateral dimensions of a disposable gate can be avoided;
- a thicker disposable gate structure can be used to provide a higher margin of error;
- the field oxide can provide a thicker oxide etch-stop than the gate oxide.

BRIEF DESCRIPTION OF THE DRAWING

The disclosed inventions will be described with reference to the accompanying drawings, which show important sample embodiments of the invention and which are incorporated in the specification hereof by reference, wherein.

Corresponding numerals and symbols in the different figures refer to corresponding parts unless otherwise indicated.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Overview of a CMP-Free Disposable Gate Process

Figure 1:
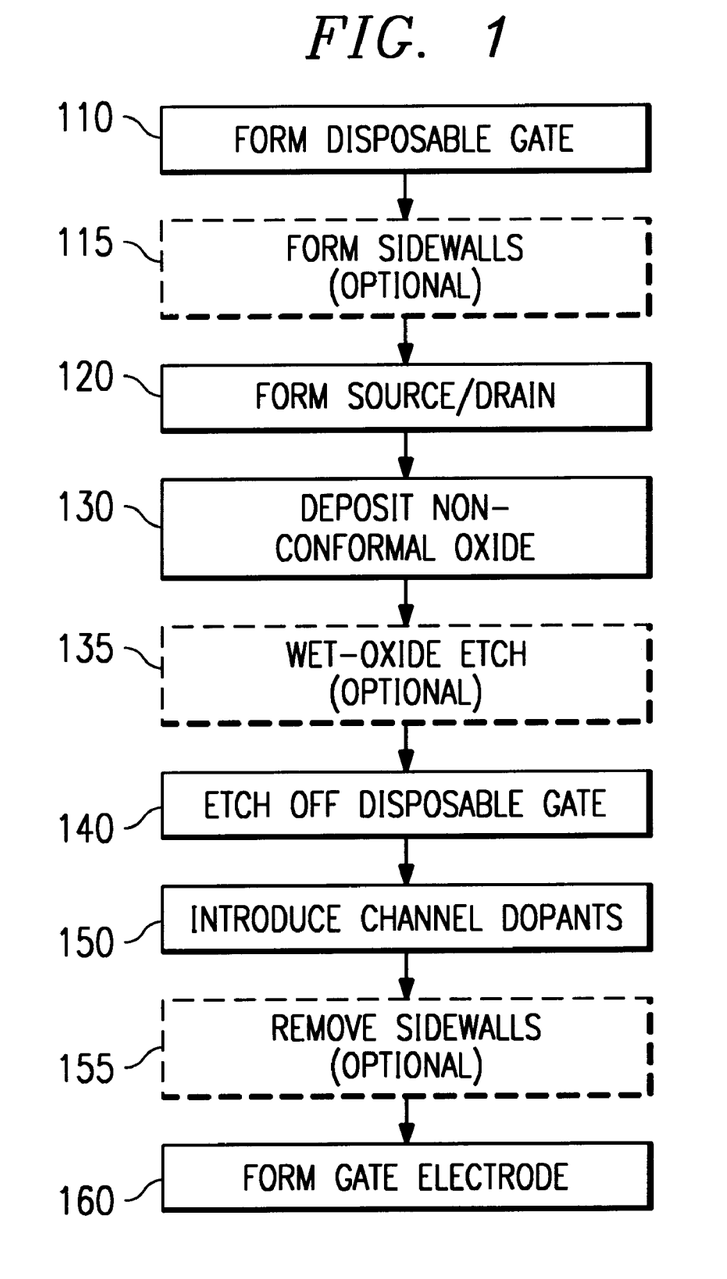
FIG. 1 shows a sample CMP-free process flow for formation of a disposable gate structure.

FIG. 1 shows a sample CMP-free process flow for forming a disposable gate structure. Those of ordinary skill in the art will realize that the process and benefits of the invention are applicable to structures for the deep submicron regime (i.e., tenth-micron and below) as well as other structures. The steps in FIG. 1 will be discussed with reference to FIGS. 3A,3E. Sample details will be discussed below in a discussion of a sample embodiment.

Figure 3A:
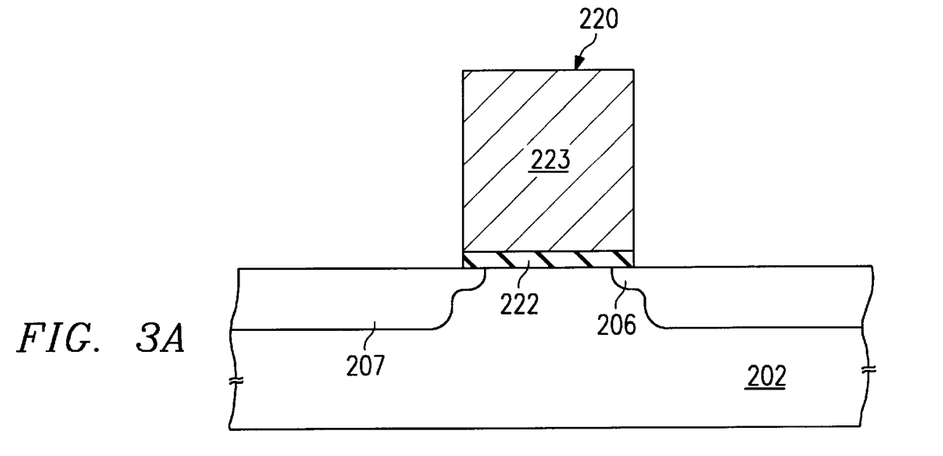
FIGS. 3A–3E are cross-sectional diagrams of a structure formed according to a preferred embodiment of the invention during various stages of fabrication.

At Step 110, a disposable gate 220 comprising a first disposable gate material 223 is formed over a sacrificial gate dielectric 222 over an area of substrate 202 where the channel region is desired. Disposable gate 220 may comprise more than one material. If more than one material is used, the materials are chosen such that they may be selectively removed with respect to the substrate, with respect to each other, and/or with respect to other subsequently formed layers (such as the optional sidewalls of Step 115). The thickness of disposable gate 220 is variable, but will be high enough to block subsequent source/drain (S/D) implants. Further sample details are provided below in the description of the sample embodiment.

Source/Drain regions 206 and 207 are formed in Step 120. Source/Drain regions may be formed in various ways known in the art and from various materials known in the art. Some examples are discussed and illustrated further below.

At Step 130, a layer of dielectric material 214 is deposited non-conformally over the structure to cover source/drain regions 206 and 207, and the top of disposable gate 220, but not the sidewalls of disposable gate 220. The dielectric material 214 is chosen such that it can be selectively removed with respect to disposable gate material 223 (or any additional materials comprising the disposable gate), and/or with respect to sacrificial gate dielectric 222.

At Step 140, disposable gate 220 is selectively removed. There is no need to planarize back (e.g., CMP or etchback) the layer of dielectric material 214 to expose the disposable gate because the non-conformal deposition of the layer of dielectric material 214 leaves the sidewalls of disposable gate 220 exposed.

At Step 150, channel doping (e.g., by means such as a Vt implant or gas immersion laser doping) is performed after removal of disposable gate 220, and either before or after the removal of the sacrificial gate dielectric 222. Because the layer of dielectric material 214 covers source/drain regions, the introduction of channel dopants is self-aligned to the source/drain regions and therefore substantially limited to only the immediate channel area (i.e., the area of the substrate which had been occupied by the disposable gate). Self-aligned implantation causes a reduction in the capacitance of the subsequently formed source/drain junction region.

After introduction of channel dopants, a new gate dielectric 210 can be grown in the space 215 left by removal of sacrificial gate dielectric 222 and disposable gate 220. A gate electrode 212 is then formed. This completes Step 160. By performing the gate processing after source/drain formation, heat treatments required by source/drain formation do not affect the gate dielectric and gate electrode. Thus, a doped polysilicon gate electrode can be used with an ultra-thin gate dielectric (i.e., 6 nm or even less than 3 nm) without having harmful dopant diffusion from the doped polysilicon through the gate dielectric into the channel region. Alternatively, a gate electrode comprising, in part, a metal can be used because the heat treatments for the source/drain formation have already been performed.

After the process flow described above, processing continues with the formation of interconnections as is known in the art. Various modifications to the process described above will be apparent to persons skilled in the art.

Sample Embodiment

FIGS. 3A–3E are cross-sectional diagrams of a sample embodiment of the invention during various stages of fabrication. Details of steps in the process flow shown in FIG. 1 will now be discussed in conjunction with FIGS. 3A–3E.

In the cross-section of a sample embodiment shown in FIG. 3A, substrate 202 is silicon. Sacrificial gate dielectric 222 is silicon dioxide, 0.1 microns wide and grown 10 nm thick. Disposable gate 220 comprises one disposable gate material 223. In this sample embodiment, disposable gate material 223 is silicon nitride, 0.1 microns wide and 150 nm thick. Disposable gate material 223 is deposited under a total pressure of 200 mTorr for 1875 seconds at 700–800 (preferably 750) degrees Celsius with a resulting film composition of Si3N4.

Non-elevated source/drain regions 207 were implanted into substrate 202, then doped in-situ, by appropriate chemistry, with an appropriate dopant for forming the desired conductivity type (e.g, antimony for an n-channel MOSFET). Shallow source/drain regions 206 were then formed by an anneal causing diffusion from source/drain regions 207 as is known in the art.

Figure 3B:
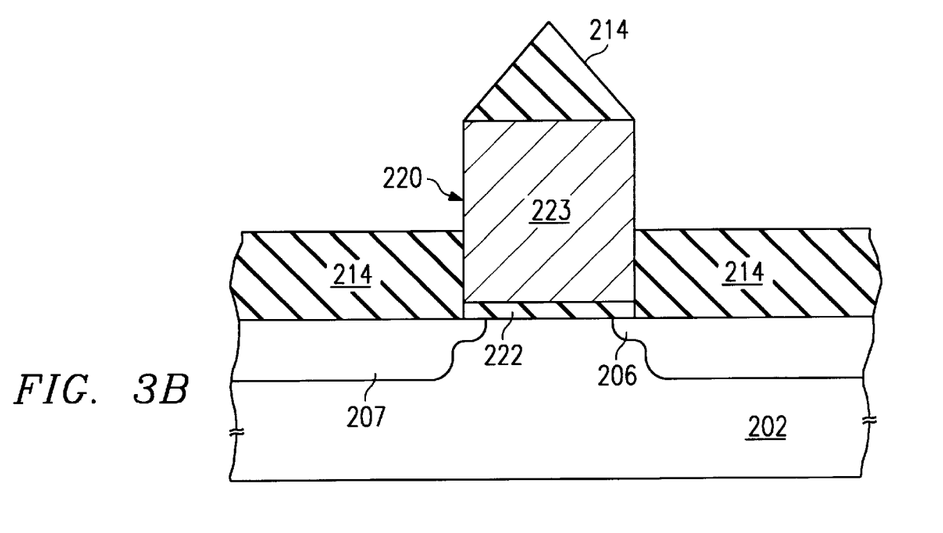

Referring to FIG. 3B, HDP-CVD oxide has been deposited non-conformally as field dielectric layer 214. Deposition of field dielectric layer 214 is preferably stopped (at a thickness of 150 nm), before it completely covers the disposable gate, so that the sidewalls of the disposable gate are left partially exposed. The non-conformal oxide was deposited from silane and oxygen at a temperature between 300 and 450 degrees Celsius (preferably 330 degrees C.). The HDP-CVD deposition used a medium to high sputtering component to achieve minimal deposition on the sidewalls of the disposable gate 220.

Figure 3C:
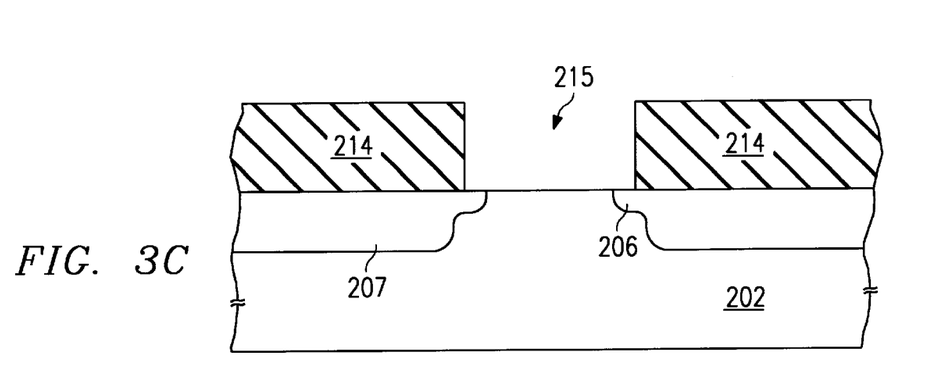

Disposable gate material 223 was then removed by hot phosphoric etch. It is preferable to introduce channel dopants after the removal of disposable gate material 223, but before the removal of sacrificial gate oxide 222. After introduction of channel dopants, sacrificial gate oxide 222 was removed by a short wet oxide etch of HF concentration and duration necessary for removal. Field dielectric layer 214 was not substantially removed by either etch removing disposable gate material 223 or sacrificial gate oxide 222. It should also be noted that substrate 202 was not etched into by removal of disposable gate material 223 or sacrificial gate oxide 222. Removal of disposable gate material 223 and sacrificial gate oxide 222 leaves space 215 in field dielectric layer 214, as shown in FIG. 3C.

Figure 3D:
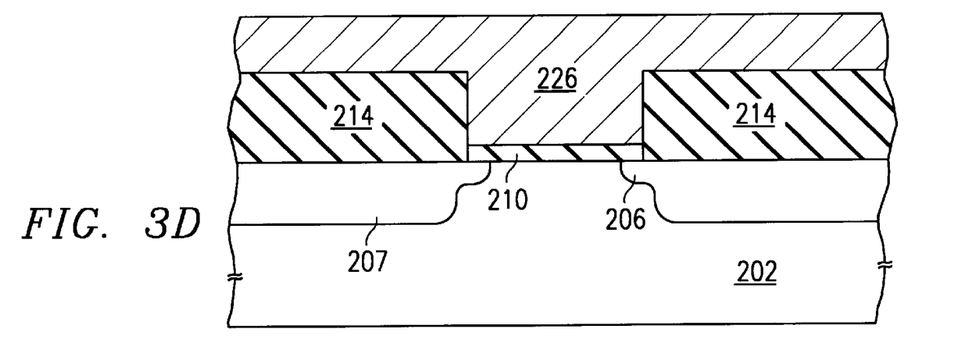

Referring to FIG. 3D, a clean gate oxide 210 was formed on substrate 202 in space 215. Gate oxide 210 comprises a thermally grown oxide (e.g., 3–3.5 nm for a 1.2V supply). Gate material 226 was then formed over gate dielectric 210 and field dielectric layer 214. In this sample embodiment, gate material 226 is aluminum and is 100 nm thick.

There are several methods that may be used to form a gate electrode 212. The preferred embodiment is the T-gate structure, shown in FIG. 3E, which is useful for further reduction of gate sheet resistance. The deposited gate material 226 has been patterned and etched to form T-gate electrode 212 extending over a portion of field dielectric layer 214.

Alternative Embodiment: Silicon-Oxynitride Field Dielectric

In this class of embodiments, silicon-oxynitride is deposited non-conformally (as in the sample embodiment) to form the field dielectric. Other process conditions remain similar to those stated above.

Alternative Embodiment: Silicon-Rich Field Dielectric

In this class of embodiments, silicon-rich off-stoichiometric silicon dioxide is deposited non-conformally to form the field dielectric. Other process conditions remain similar to those stated above.

Alternative Embodiment: Silicon-Germanium Substrate

A silicon-germanium substrate may be used instead of the silicon substrate of the sample embodiment. Other process conditions remain similar to those stated above.

Alternative Embodiment: Extension of Sacrificial Gate Dielectric

Rather than being the width of the gate as in the sample embodiment, sacrificial gate dielectric 222 may be extended over the entire substrate. If sidewall dielectrics are subsequently formed, any portions of sacrificial gate dielectric 222 not covered by the formation of sidewall dielectrics and the disposable gate may be removed. Other process conditions remain similar to those stated above.

Alternative Embodiment: Disposable Gate Materials

If sacrificial gate dielectric 222 comprises an oxide, then disposable gate material 223 may comprise silicon-germanium or silicon. Other process conditions remain similar to those stated above.

Alternative Embodiment: LPCVD Polysilicon Disposable Gate

Polysilicon may be deposited under LPCVD conditions as disposable gate material 223. If a polysilicon is used as disposable gate material 223, then sidewall spacers 230 are preferably present. A highly selective polysilicon/oxide etch such as choline would be used to remove the polysilicon. For example, a 5% choline solution etches phosphorous-doped polysilicon at a rate of about 25 nm/minute at room temperature, while it etches LPCVD nitride and thermal oxide at rates of <0.1 nm/minute. Other process conditions remain similar to those stated above.

Alternative Embodiment: Sacrificial Gate Dielectric

If substrate 202 is silicon, silicon-germanium may be used as sacrificial gate material 222 because silicon-germanium may be removed with a high selectivity to silicon. This would prevent damage to the substrate by removal of sacrificial gate material 222. Other process conditions remain similar to those stated above.

Alternative Embodiment: Non-T-Gate by a Damascene Process

Figure 3E:
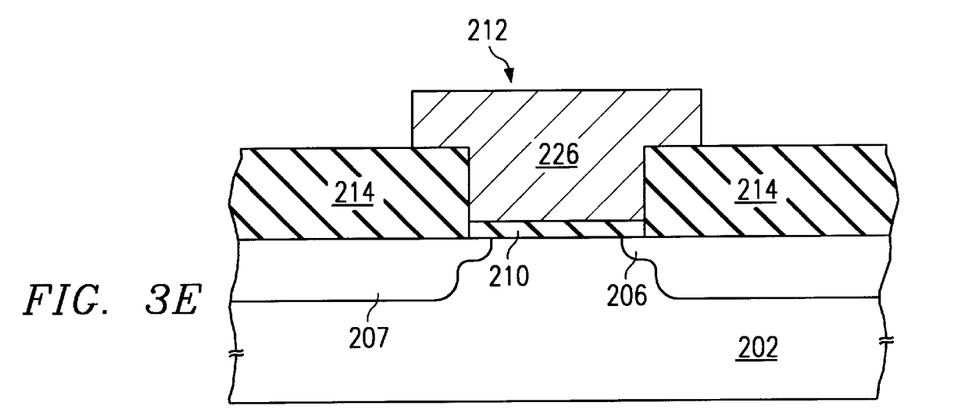
Figure 4:
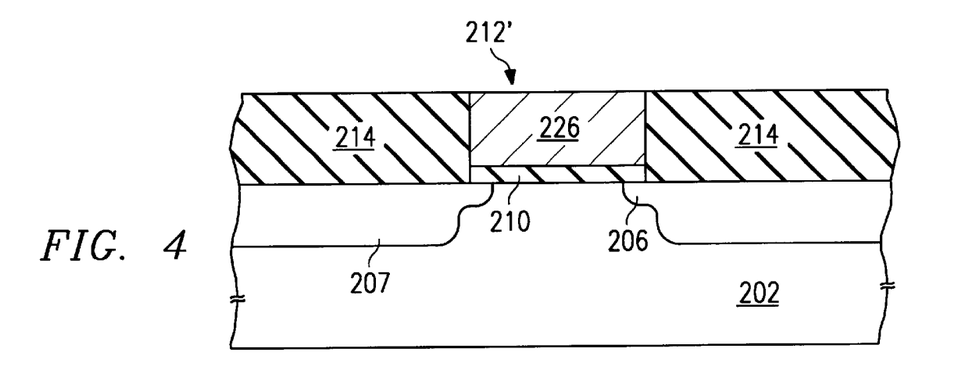
FIG. 4 is a cross-sectional diagram of a structure formed according to an alternative embodiment of the invention during various stages of fabrication.

Although it offers some advantages, the T-gate structure shown in FIG. 3E is not required to practice the invention. Alternatively, a self-aligned non-T-gate structure 212', as shown in FIG. 4, can be formed by numerous conventional processes (e.g, damascene).

In a conventional damascene process, an interlevel dielectric layer (ILD) is formed over a patterned underlying metal layer (which may be e.g., Metal-1 or Metal-4, and may be e.g., aluminum alloy or another metal). The ILD is then patterned and etched to cut metal pathways. Next a diffusion barrier and adhesion promotion layer is deposited, followed by blanket deposition of a low-resistivity metal (such as copper). A CMP process is then used to form flush gate structure 212'.

In an alternative damascene process, transistors are beneath a conductor layer (typically an aluminum alloy) which is surrounded by a lower interlevel dielectric. Thereafter, an upper interlevel dielectric (e.g., BPSG over TEOS-deposited SiO2) is deposited and planarized by conventional methods (e.g. chemical-mechanical polishing).

Thereafter, the upper interlevel dielectric is patterned and etched to form slots where lines of metallization are desired, and also to form deeper holes where vias are desired (i.e., where an electrical contact to the underlying conductor layer is desired). Thereafter, a diffusion barrier layer (e.g., a conductive nitride of titanium or tungsten) is deposited. A highly conductive metal (e.g., tungsten) is then deposited overall by conventional methods, and etched back and polished (using one of the methods described above) so that the flat surface of the interlevel dielectric is exposed wherever the metal is not present.

Other process conditions remain similar to those stated above.

Alternative Embodiments: Elevated Source/Drain Structure with Sidewall Spacers FIGS. 5A–5E are cross-sectional diagrams of an alternative embodiment of the invention during various stages of fabrication.

Figure 5A:
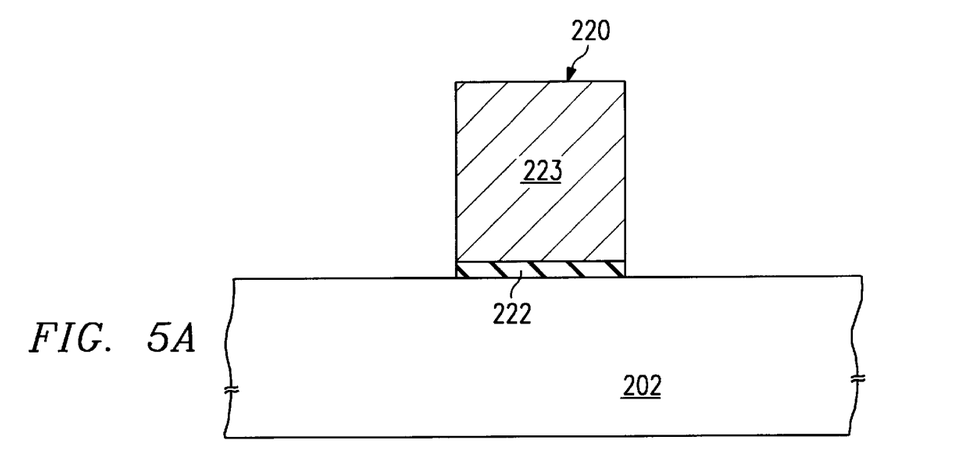
FIGS. 5A–5E are cross-sectional diagrams of a structure formed according to an alternative embodiment of the invention during various stages of fabrication.

As shown in FIG. 5A, disposable gate 220 comprising a nitride layer 223 was formed over sacrificial gate oxide 222.

Figure 5B:
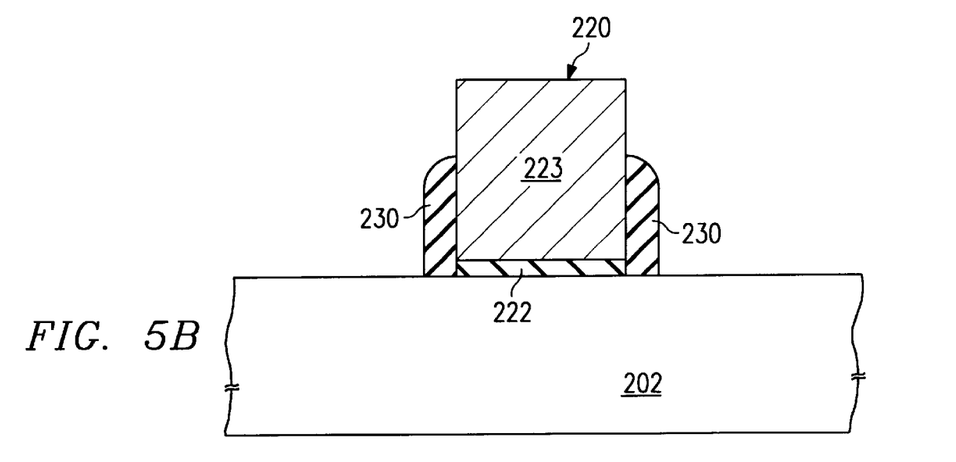

FIG. 5B shows sidewall dielectrics 230 formed on the sidewalls of disposable gate 220 to complete optional Step 115. If sidewalls are desired, they are formed from a material such that materials comprising disposable gate 220 may be selectively removed without substantially removing the sidewall. Sidewall dielectric 230 is thin, less than 20 nm for the deep sub-micron device in this alternative sample embodiment. Combinations of materials and thicknesses for forming sidewall dielectrics 230 will be apparent to those of ordinary skill in the art.

Figure 5C:
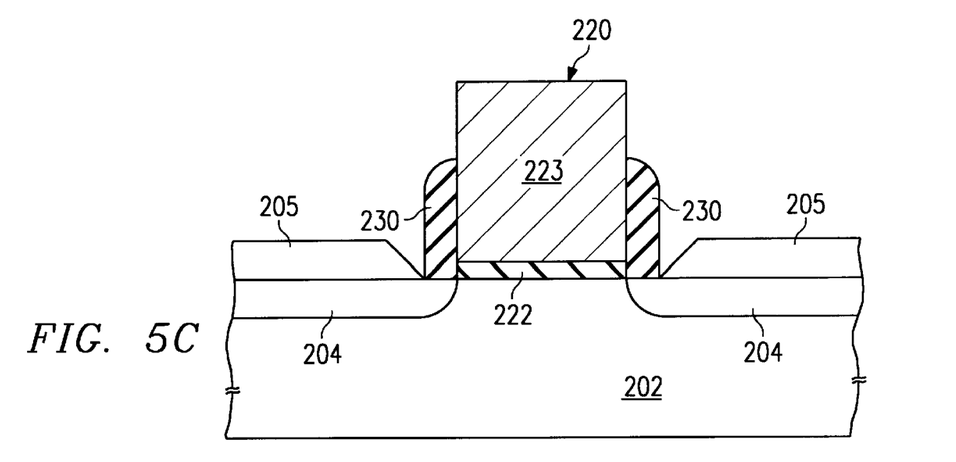

At Step 120, elevated source/drain regions 205 as shown in FIG. 5C are formed by selectively forming an epitaxial layer of silicon over substrate 202 adjacent disposable gate 220. Disposable gate 220 provides a masking layer for the epitaxial process. Thus, elevated source/drain regions 205 are self-aligned to disposable gate 220. Angled faceting of an epitaxially formed elevated source/drain region 205 at the edge of the disposable gate 220 may occur. The degree of faceting may be partially controlled by adjusting process parameters of the cleaning and deposition processes.

Elevated source/drain regions 205 are next doped and shallow source/drain junction regions 204 are formed by diffusion of dopants from the elevated source/drain regions 205: The preferred step is to anneal the structure at sufficient time and temperature to diffuse dopant from the elevated source/drain regions 205 to form shallow source/drain junction regions 204. Diffusing the dopant from an elevated source/drain structure allows for shallower source/drain junction regions 204 than are possible with an implant doped source/drain junction region. This completes Step 120.

Figure 5D:
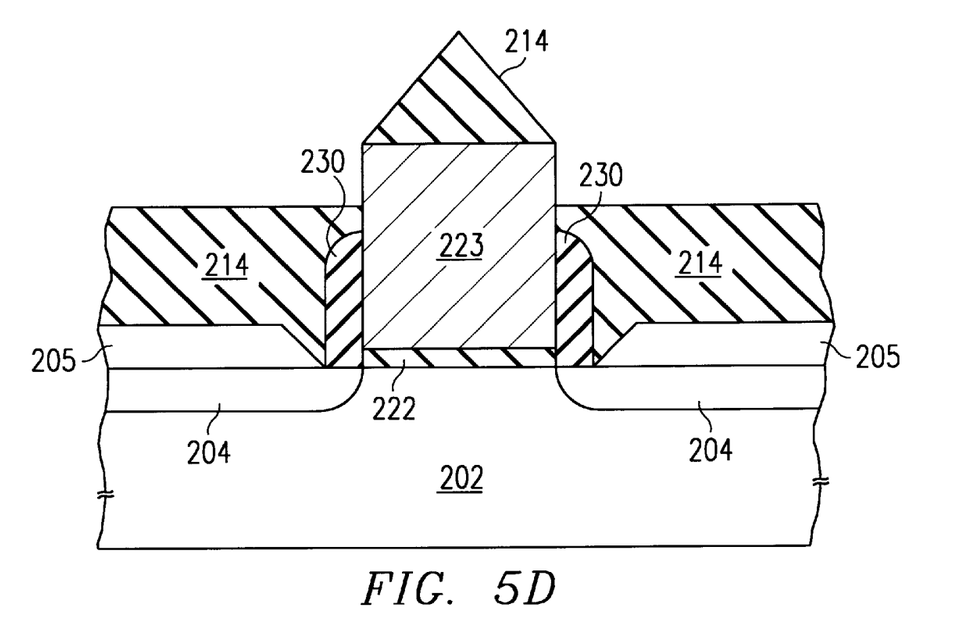
Figure 5E:
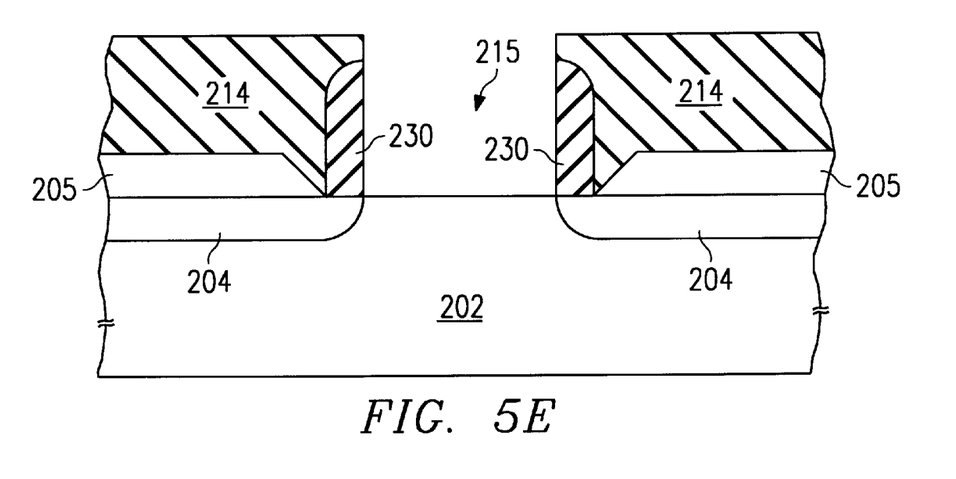

In FIG. 5D, dielectric material 214 is HDP-CVD oxide non-conformally deposited such that removal of disposable gate 220 can proceed directly, as described in the main embodiment. As seen in FIG. 5E, dielectric layer 214 and sidewall dielectric 230 are not substantially removed by etches which removed disposable gate 220 and sacrificial gate dielectric 222 and left space 215.

A T-gate electrode (e.g., formed by pattern and etch) or non-T-gate electrode (e.g., formed by a damascene process) can then be formed in space 215. Other process conditions remain similar to those stated above.

Alternative Embodiment: Materials for Sidewall Spacers

Various materials can be used to form optional sidewall spacers are present. Some materials include silicon-oxynitride, silicon-rich off-stoichiometric silicon dioxide, or an oxide/nitride composite. The materials comprising optional sidewall spacers will be chosen such that selectivity during etching is maintained as in the sample embodiment. For example, if sacrificial gate dielectric 222 is silicon dioxide and disposable gate material 223 is silicon-germanium or silicon, sidewall dielectric 230 is an oxide/nitride composite. Other process conditions remain similar to those stated above.

Alternative Embodiment: Formation of Sidewall Spacers

As shown in the alternative embodiment of FIG. 5B, sidewall spacers may be aligned next to the sidewalls of the disposable gate prior to removal of the disposable gate. Alternatively, sidewall spacers may be formed after removal of the disposable gate. Sidewalls so formed will be aligned next to the sidewalls of the HDP-CVD oxide in the space left by the removal of the disposable gate. Other process conditions remain similar to those stated above.

Alternative Embodiment: Gate Cap

An additional disposable gate material may be formed over first disposable gate material 223 as a cap for disposable gate 220. If a cap is present and elevated source/drain regions are to be formed, the cap optionally may be stripped prior to selective epitaxial deposition of the elevated source/drain regions. Polysilicon can then form on disposable gate 220 during the epitaxial deposition and provide extra gate height for the subsequent etch removing disposable gate 220. Providing extra gate height in this manner is particularly advantageous after sidewall spacers (if desired) are formed adjacent to the disposable gate. This is because the extra height exposes more of the disposable gate above the sidewall spacers. Other process conditions remain similar to those stated above.

Alternative Embodiment: Larger Gates

A limit on the lateral dimensions of a disposable gate can be avoided under the disclosed process. In a larger disposable gate structure, a mask is formed over the structure after deposition of the non-conformal oxide. A patterned removal of the non-conformal oxide (e.g., down the center of the oxide layer covering the top of disposable gate 220) will cut slots in the oxide. These slots speed up the removal of the disposable gate because the etch can now work from the top as well as the sides of disposable gate 220. Other process conditions remain similar to those stated above.

Alternative Embodiment: Pattern and Etch to Form Elevated Source/Drain Regions Instead of epitaxially forming elevated source/drain regions 205 of FIG. 5C, elevated source/drain regions 205 may be formed by a non-selective deposition of the desired conductive material followed by pattern and etch of this material. Other process conditions remain similar to those stated above.

Alternative Embodiment: Metallic Elevated Source/Drain Regions

Elevated source/drain regions may be formed from metals or combinations thereof. If the elevated source/drain regions are metallic, doping is unnecessary. Other process conditions remain similar to those stated above.

Alternative Embodiment: Methods for Forming Ultra-Shallow Source/Drain

Rather than the anneal performed to diffuse dopant from elevated source/drain 205 to form ultra-shallow source/drain 204, adequate diffusion to form ultra-shallow source/drain 204 may be obtained during the deposition of the elevated source/drain if the deposition time or temperature is sufficient. The anneal may also be performed earlier in the process if desired or it may be part of another process such as the formation of a gate dielectric. Other process conditions remain similar to those stated above.

It should also be noted that ultra-shallow source/drain regions 204 may be formed in other ways not requiring diffusion from elevated source/drain regions 205. For example, regions 204 may be diffused from an overlying layer such a polysilicon-germanium or doped oxide, they may implant doped using a variety of techniques to keep the regions 204 shallow, or they may be formed using gas-immersion laser doping. Other process conditions remain similar to those stated above.

Alternative Embodiment: Cladding of Source/Drain Regions

Cladding forms a low resistance material over the desired structure and may be accomplished in a number of ways including salicidation. Salicidation reduces values of contact resistance, sheet resistivity of the shallow junctions of the source/drain regions, and interconnect resistance of the gate lines. A metal, preferably 100 nm of titanium, is deposited over the structure and reacted with the exposed silicon areas of the source/drain regions to form a silicide layer. The unreacted titanium is then selectively removed, leaving the silicide where formed on the structure. Cladding may also be accomplished by a metal deposition, followed by pattern and etch.

A selected portion of source/drain regions may be cladded after their formation. Cladding prior to the formation of the gate dielectric and gate electrode reduces the heat treatments seen by the gate dielectric and gate electrode. Cladding of the elevated source/drain regions 204 should not, however, occur over the entire region 205. Cladding at the ends of the faceted regions is preferably avoided (e.g. by use of a sidewall spacer that is thick enough to cover any facets) since a gate dielectric is desired at that region and a thermally grown gate dielectric would not form over a cladded region. Other process conditions remain similar to those stated above.

If the final gate is polysilicon, (whether T-gate or non-T-gate), then it too can be advantageously cladded. The T-gate structure may be cladded after the final gate material is deposited, but before it is etched. After deposition of the cladding material, the cladding material and gate material are patterned and etched. In this case, both the gate material and cladding material extend over the dielectric layer. In a non-T-gate structure, only the cladding layer extends over dielectric layer. Other process conditions remain similar to those stated above.

Alternative Embodiment: Isotropic Oxide Etch

Because dielectric material 214 is chosen such that it may be etched selectively with respect to disposable gate material 223, a short wet-oxide-etch step may be performed to remove any oxide that deposits on the sides of disposable gate 220. Disposable gate 220 would then be partially exposed, as it appears in FIG. 3B. The concentration and duration of the etch will vary with the amount oxide needing removal from the sidewalls (e.g., 2–10 rum of oxide may need to be removed to expose the sidewalls of the disposable gate; 1% HF removes 2 nm of oxide/minute.) This completes optional Step 135. Other process conditions remain similar to those stated above.

Alternative Embodiment: Post-Deposition Doping of Source/Drain

Rather than doping elevated source/drain in-situ, as in the sample embodiment, elevated source/drain regions may alternatively be doped after deposition by implantation. Other process conditions remain similar to those stated above.

Alternative Embodiment: Removal of Sidewalls and Subsequent Gate Extension

After channel doping, but before forming of the gate electrode, sidewall dielectrics 230 (if present) may be selectively removed. If sidewall dielectrics 230 are removed, then the final gate material and/or the final gate dielectric can extend over the tips of elevated source/drain regions (if present). When gate dielectric/gate material extend over the facets of elevated source/drain regions, the gate dielectric in part separates the gate material from the source/drain regions. If sidewall dielectrics 230 are removed, then the gate electrode can be separated from elevated source/drain regions by the final gate dielectric only. Extension of the final gate material over source/drain regions may be beneficial in reducing series resistance of the subsequently formed MOSFET although an increase in gate-to-drain capacitance will additionally result. The existence and/or optimization of the extension of the final gate material depends on the application and trade-offs between such issues as the before mentioned series resistance and overlap capacitance. This completes optional Step 155. Other process conditions remain similar to those stated above.

If sidewall dielectrics 230 are not removed prior to forming of the gate dielectric and gate material, then the final gate material and the final gate dielectric do not extend over the tips of elevated source/drain regions within the space left by the removal of the disposable gate. The presence of sidewall dielectric 230 prevents the subsequently formed gate electrode from being separated from elevated source/drain regions by only the final gate dielectric. Forming the HDP-CVD field oxide such that elevated source/drain regions are separated from the overlying portions of a final T-gate structure results in a low gate-to-drain capacitance between elevated source/drain regions and the overlying portions of the T-gate structure. Other process remain similar to those stated above.

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

While the inventions have been described with primary reference to a single-poly process, it will be readily recognized that these inventions can also be applied to process with two, three, or more layers of polysilicon or polycide.

Similarly, it will be readily recognized that the described process steps can also be embedded into hybrid process flows, such as BiCMOS or smart-power processes.

Other gate dielectric materials may be used, such as a grown and/or deposited oxide, oxynitride, or any other suitable gate dielectric material including materials with higher dielectric constant than silicon dioxide may be used.

Other gate materials may be used such as a non-crystalline material substantially containing silicon or silicon-germanium, a doped polysilicon layer, a doped amorphous silicon layer, a metal layer, a composite material comprised of different metals or a combination of metal and semiconductor material, or other appropriate conductive materials (e.g., materials including tungsten, titanium nitride, or copper). The final gate can also be stacked (e.g., aluminum or tungsten over titanium nitride, or tungsten over tungsten nitride over polysilicon). It is noted that if a semiconductor material is utilized in part for the gate material, this semiconductor material can be doped (with the desired n or p type dopants) in-situ or doped after deposition by means such as implantation and anneal.

Instead of the pattern and etch formation, the T-gate structure in the sample embodiment may be formed by means such as a selective epitaxy of semiconductor or metal with the epitaxial overgrowth resulting in a T-gate structure.

The thickness of non-conformal dielectric layer may be tailored to allow for a low gate-to-drain capacitance between elevated source/drain regions (if used) and the overlying portion of a T-gate structure, provided the sidewalls of the disposable gate are left partially exposed.

Source/Drain regions may be formed using other methods known in the art (e.g., by solid source diffusion into the substrate.)

An n-channel MOSFET may be formed using alternative source/drain dopants, such as phosphorous and/or arsenic. Similarly, if a p-channel MOSFET is desired, a p-type dopant, such as boron, may be used to dope source/drain regions.

What is claimed is:

1. A fabrication method, comprising the steps of:
   (a.) forming a disposable gate over a sacrificial gate dielectric over a semiconductor active area;
   (b.) forming source/drain regions adjacent to said disposable gate;
   (c.) depositing a dielectric material non-conformally over said source/drain regions and said disposable gate, while leaving portions of said disposable gate exposed, wherein a height of said dielectric material over said source/drain regions is less than a height of said disposable gate;
   (d.) selectively removing said disposable gate, without removing said dielectric material above said source/drain regions; and
   (e.) forming a conductive gate electrode in the space left by said disposable gate.

2. The fabrication method of claim 1, wherein said step (c.) comprises the sub-step of:

(c1.) depositing said dielectric material by high-density-plasma-chemical-vapor-deposition.

3. The fabrication method of claim 1, wherein said step (c.) comprises the sub-step of:
   (c2.) removing any of said dielectric material from the sides of said disposable gate by a short isotropic etch.

4. The fabrication method of claim 1, wherein the material comprising said semiconductor active area is selected from the group consisting of silicon and silicon-germanium.

5. The fabrication method of claim 1, wherein said disposable gate comprises a material selected from the group consisting of silicon, silicon-germanium, polysilicon, and silicon nitride.

6. The fabrication method of claim 1, wherein said sacrificial gate dielectric comprises a material selected from the group consisting of silicon dioxide and silicon germanium.

7. The fabrication method of claim 1, wherein said step (b.) comprises the sub-step of:
   (b1.) forming an elevated source/drain region.

8. The fabrication method of claim 7, further comprising the step of:
   diffusing dopant from said elevated source/drain region into said substrate.

9. The fabrication method of claim 1, further comprising the step of performing a self-aligned introduction of channel dopants after said step of forming said source/drain region and prior to said step of forming a gate electrode.

10. The fabrication method of claim 1, wherein said step (e.) comprises the sub-step of:
    (e1.) removing said sacrificial gate dielectric; and
    (e2.) forming a gate dielectric in the space left by removal of said sacrificial gate dielectric.

11. The method of claim 1, further comprising the step of:
    (f.) cladding said gate electrode.

12. A fabrication method, comprising the steps of:
    (a.) forming a disposable gate over a sacrificial gate dielectric over a sericonductor active area of a substrate;
    (b.) forming source/drain regions adjacent to said disposable gate;
    (c.) depositing a dielectric layer non-conformally over said source/drain regions and said disposable gate, wherein a height of said dielectric layer over said source/drain regions is less than a height of said disposable gate;
    (d.) removing said disposable gate by selective isotropic etch and removing said sacrificial gate dielectric by selective isotropic etch;
    (e.) growing a gate dielectric in the space left by said disposable gate and said sacrfcial gate dielectric; and
    (f.) forming a gate electrode over said gate dielectric.

13. The method of claim 12, wherein said step (b.) comprises the sub-step of:
    (b1.) forming elevated source/drain regions by selective epitaxy, using said disposable gate as a mask.

14. The method of claim 12, wherein said step (d.) comprises the sub-step of performing a self-aligned introduction of channel dopants into said semiconductor active area after removing said disposable gate but before removing said sacrificial gate dielectric.

15. The fabrication method of claim 12, wherein said step (c.) comprises the sub-step of: (c1.) depositing said dielectric layer by high-density-plasma-chemical vapor deposition.

16. The method of claim 12, further comprising the step of:
    (g.) siliciding said gate electrode.

* * * * *